(12) United States Patent
Brown et al.

(10) Patent No.: US 6,686,672 B2
(45) Date of Patent: *Feb. 3, 2004

(54) MODULAR EMERGENCY STOP RELAY SYSTEM

(75) Inventors: Paul C. Brown, Columbia, SC (US); Kevin M. Zomchek, Milwaukee, WI (US); Homer S. Sambar, Shorewood, WI (US)

(73) Assignee: Rockwell Automation Technologies, Inc., Mayfield Heights, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/407,662

(22) Filed: Sep. 28, 1999

(65) Prior Publication Data

US 2002/0038981 A1 Apr. 4, 2002

(51) Int. Cl.$^7$ ............................................. G08B 21/00
(52) U.S. Cl. .................. 307/125; 307/326; 361/632; 439/350
(58) Field of Search .................. 307/116, 125, 307/134, 147, 326; 361/600, 601, 627, 622, 625, 631, 632, 634; 200/50.32, 307; 439/350, 351, 352, 353, 357, 377; 335/202, 132

(56) References Cited

U.S. PATENT DOCUMENTS

| | | | | |
|---|---|---|---|---|
| 3,734,230 A | | 5/1973 | Tanaka ........................ 180/99 |
| 3,758,736 A | | 9/1973 | Tanaka ........................ 200/157 |
| 3,974,672 A | | 8/1976 | Herbst ............................ 72/21 |
| 4,356,368 A | * | 10/1982 | Osika ........................ 335/132 |
| 4,558,914 A | * | 12/1985 | Prager et al. ................ 361/686 |
| 4,769,557 A | * | 9/1988 | Houf et al. .................. 307/147 |
| 4,912,384 A | | 3/1990 | Kinoshita et al. ............ 318/569 |
| 4,926,282 A | * | 5/1990 | McGhie ....................... 335/155 |
| 4,973,929 A | * | 11/1990 | Duchemin ................... 335/132 |
| 5,000,692 A | * | 3/1991 | Taniguchi et al. .......... 439/160 |
| 5,003,430 A | * | 3/1991 | VonArx et al. .............. 361/736 |
| 5,018,043 A | * | 5/1991 | Moreau ....................... 361/187 |
| 5,018,050 A | * | 5/1991 | Maenishi et al. ............ 335/202 |
| 5,043,847 A | * | 8/1991 | Deinhardt et al. .......... 361/725 |
| 5,212,433 A | | 5/1993 | Yasuyuki ............... 318/568.13 |
| 5,408,061 A | | 4/1995 | Martin ........................ 200/538 |
| 5,455,744 A | * | 10/1995 | Watanabe ................... 174/250 |
| 5,469,031 A | | 11/1995 | Chorey ........................ 318/375 |
| 5,493,194 A | * | 2/1996 | Damiano et al. ........... 361/733 |
| 5,541,810 A | * | 7/1996 | Donhauser et al. ......... 361/686 |
| 5,568,356 A | * | 10/1996 | Schwartz .................... 200/1 R |
| 5,606,299 A | * | 2/1997 | Innes et al. ................. 335/202 |

(List continued on next page.)

*Primary Examiner*—Brian Sircus
*Assistant Examiner*—Roberto J. Rios
(74) *Attorney, Agent, or Firm*—Amin & Turocy, LLP; Alexander M. Gerasimow

(57) ABSTRACT

A modular emergency stop device including a switch unit and a control unit. The switch unit includes a switch which converts from a normal state to an emergency state when an emergency stop is necessary and a housing for the switch. The control unit includes a controller which controls a power source for a machine and a housing for the controller. The switch unit's housing and the control unit's housing are adapted to be selectively coupled together and uncoupled from each other. The switch is operably coupled to the controller when the housings are coupled together whereby the controller may appropriately control the machine's power source when the switch is converted to the emergency state. To replace the switch, the switch's housing is uncoupled from the controller's housing to remove the switch unit and a new switch unit is coupled to the controller's housing.

21 Claims, 5 Drawing Sheets

U.S. PATENT DOCUMENTS

| | | | | |
|---|---|---|---|---|
| 5,652,420 A | * | 7/1997 | Innes et al. | 200/50.32 |
| 5,691,871 A | * | 11/1997 | Innes | 361/96 |
| 5,699,222 A | * | 12/1997 | Innes | 307/134 |
| 5,870,277 A | * | 2/1999 | Girard et al. | 361/267 |
| 5,870,278 A | * | 2/1999 | Girard et al. | 361/627 |
| 5,879,173 A | * | 3/1999 | Poplawski et al. | 439/354 |
| 6,008,985 A | * | 12/1999 | Lake et al. | 361/683 |
| 6,038,130 A | * | 3/2000 | Boeck et al. | 361/729 |
| 6,140,896 A | * | 10/2000 | Heckenkamp | 335/202 |
| 6,147,419 A | * | 11/2000 | Girard | 307/116 |
| 6,172,875 B1 | * | 1/2001 | Suzuki et al. | 361/686 |
| 6,184,762 B1 | * | 2/2001 | Reiss et al. | 335/202 |
| 6,215,204 B1 | * | 4/2001 | Brown et al. | 307/326 |
| 6,232,859 B1 | * | 5/2001 | Christensen et al. | 335/132 |
| 6,411,184 B1 | * | 6/2002 | Comtois et al. | 335/132 |
| 6,452,468 B1 | * | 9/2002 | Jacq et al. | 335/132 |
| 6,472,963 B1 | * | 10/2002 | Liu et al. | 335/132 |
| 6,531,940 B1 | * | 3/2003 | Busch | 335/132 |

* cited by examiner

MODULAR EMERGENCY STOP RELAY SYSTEM

FIELD OF THE INVENTION

This invention relates generally as indicated to a modular emergency stop device and system and more particularly to an emergency stop device and system having a switch unit and a control unit that may be coupled/uncoupled in a modular manner.

BACKGROUND OF THE INVENTION

A machine is typically powered by an electrical power source and typically has an on/off switch for use during normal operating conditions. For safety reasons, a machine will usually also include an emergency stop device for terminating electrical power to the machine in an emergency situation. While the design of an emergency stop device may vary greatly, the device will generally include a switch which converts from a normal state to an emergency state when an emergency stop is necessary and a controller which controls the power source for the motor or machine. The switch and controller typically are enclosed in a housing or casing to protect them against weather, dust, explosive situations, or other hazards presented by the environment of the particular machine.

In a more sophisticated emergency stop device, the switch will include a circuit board including, among other things, a series of contacts that are either normally closed or normally open contacts. The controller in a sophisticated emergency stop device will usually include a microprocessor for appropriating controlling the machine's power source in an emergency situation. The switch, and specifically its contacts, are usually considered component most vulnerable to damage and deterioration. However, in view of the criticality of the switch in the operation of the emergency stop device, a faulty contact must be replaced or else the machine will not run until the relays are replaced. For this same reason, the ability to periodically inspect and/or test switch components could be a very important part of a preventive maintenance plan but such inspection/testing is not always possible or at least not practical.

Accordingly, the inventor appreciated that a need remains for an emergency stop device which allows efficient and convenient replacement, inspection and/or testing of the switch components.

SUMMARY OF THE INVENTION

The present invention provides an emergency stop device wherein the switch and the controller are contained in separate modular units. This modular construction allows the switch to be conveniently removed from the controller and then replaced, inspected and/or tested.

More particularly, the present invention provides a modular emergency stop device comprising a switch unit and a control unit. The switch unit includes a switch which converts from a normal state to an emergency state when an emergency stop is necessary and a housing for the switch. The control unit includes a controller which controls a power source for a machine and a housing for the controller. The switch unit's housing and the control unit's housing are adapted to be selectively coupled/uncoupled relative to each other. When the housings are coupled together, the switch is operably coupled to the controller, whereby the controller may appropriately control the machine's power source when the switch is converted to the emergency state. Preferably, the housings include a quick-release coupling arrangement therebetween.

The switch may comprise a circuit arrangement necessary to convert the switch to the emergency state if an emergency stop is necessary. The circuit may include, among other things, contact pins which are usually the component most vulnerable to damage and deterioration in the emergency stop device. To replace the switch, the switch unit's housing is uncoupled from the control unit's housing to remove the switch unit and a new switch unit is coupled to the controller's housing. Likewise, to test the switch, the switch unit's housing is uncoupled from the control unit's housing to remove the switch unit, the uncoupled switch unit is tested, and the tested switch unit is recoupled to the controller unit if testing reveals that the switch is still acceptable. Preferably, the switch unit's housing includes a plurality of housing sections latched together to form a casing for the switch and/or the control unit's housing includes a plurality of housing sections latched together to form a casing for the controller. For example, the switch's housing may include a front housing section and rear housing section and the controller's housing may include a front housing section and a rear housing section. In this manner, the switch and/or controller may be easily accessed from its respective housing by unlatching the housing sections.

An emergency stop system may be compiled by interconnecting directly (or substantially directly) a plurality of modular emergency stop devices via connectors which eliminates field wiring therebetween and improves system reliability. Additionally or alternatively, diagnostics or other functions could be provided by the additional control units. To this end, each of the controllers would preferably include a network interconnection base and the control units' housings would each include a window for this base to facilitate the interconnection of various modules.

As indicated above, the modular coupling between the switch unit and the control unit provides many advantages over traditional single unit emergency stop devices in the areas of replacement, testing, and/or repair. A further manufacturing advantage is that the controller may be programmed to be compatible with a plurality of different switch units for different machines and/or different emergency stop conditions. The appropriate type of switch unit for the machine and/or the desired emergency stop conditions could then be selected and the controller provided with the selected switch unit.

These and other features of the invention are fully described and particularly pointed out in the claims. The following descriptive annexed drawings set forth in detail certain illustrative embodiments, these embodiments being indicative of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 2:
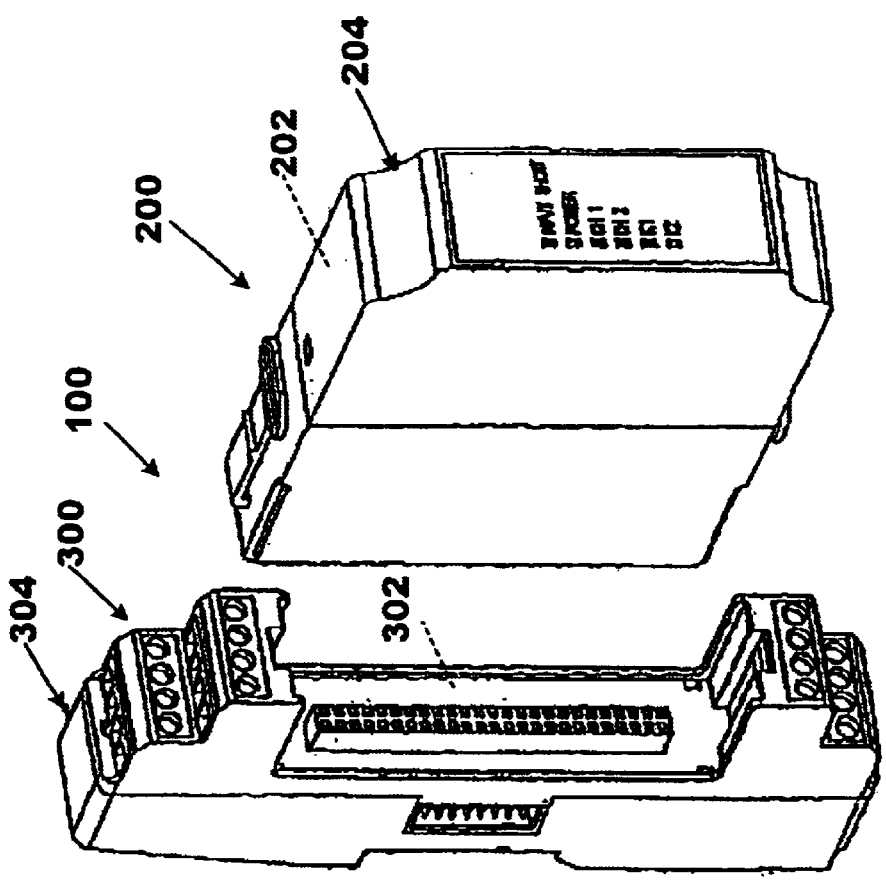
FIG. 2 is another perspective view of the modular emergency stop device, the switch unit and the control unit being shown uncoupled from each other.
Figure 1:
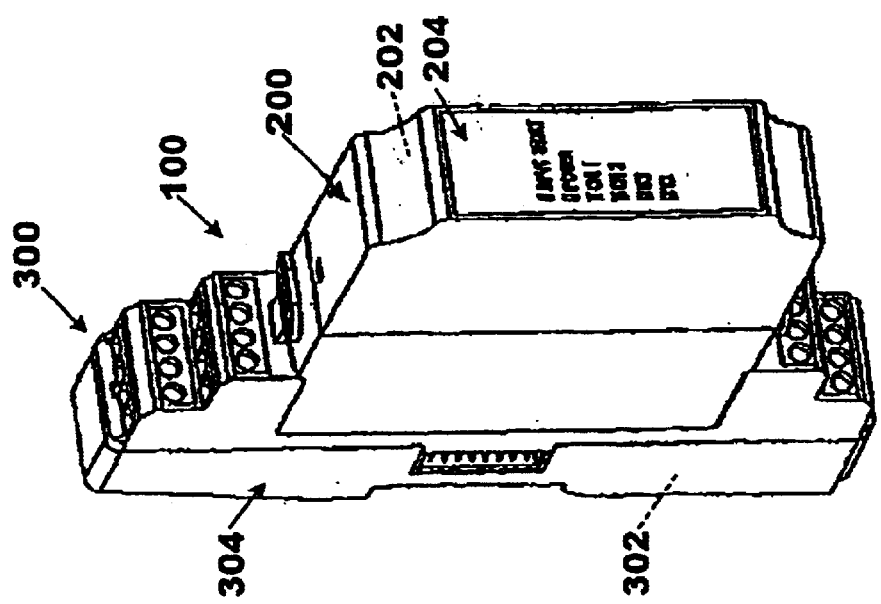
FIG. 1 is a perspective view of a modular emergency stop device according to the present invention, the device including a switch unit and a control unit which are shown coupled together in a modular manner.

Referring now to the drawings in detail, and initially to FIGS. 1 and 2, an emergency stop device 100 according to the present invention is shown. The emergency stop device 100 is designed to stop the motor of a machine in an emergency situation. As is explained in more detail below, the device 100 has a modular construction that provides the ability to periodically inspect and/or test certain components, as well as other networking and/or manufacturing advantages.

The emergency stop device 100 comprises a switch unit 200 and a control unit 300 which can be selectively coupled together in a modular manner. The switch unit 200 includes a switch 202 which converts from a normal state to an emergency state when an emergency stop is necessary and a housing 204 for the switch 202. The control unit 300 includes a controller 302 which controls a power source for the machine and a housing 304 for the controller 302.

When the modular units 200 and 300 are coupled together, such as is shown in FIG. 1, the switch 202 is operably coupled to the controller 302 whereby the controller 302 may appropriately control the power source when the switch 202 is converted to the emergency state. Additionally, the units 200 and 300 may be selectively uncoupled from each other to inspect, replace, and/or repair one of the units independent of the other. Typically, the switch unit 200 would be the unit removed since it contains components (e.g. contact pins 208 introduced below) usually more prone to damage and/or deterioration than the components of the control unit 300.

Figure 3:
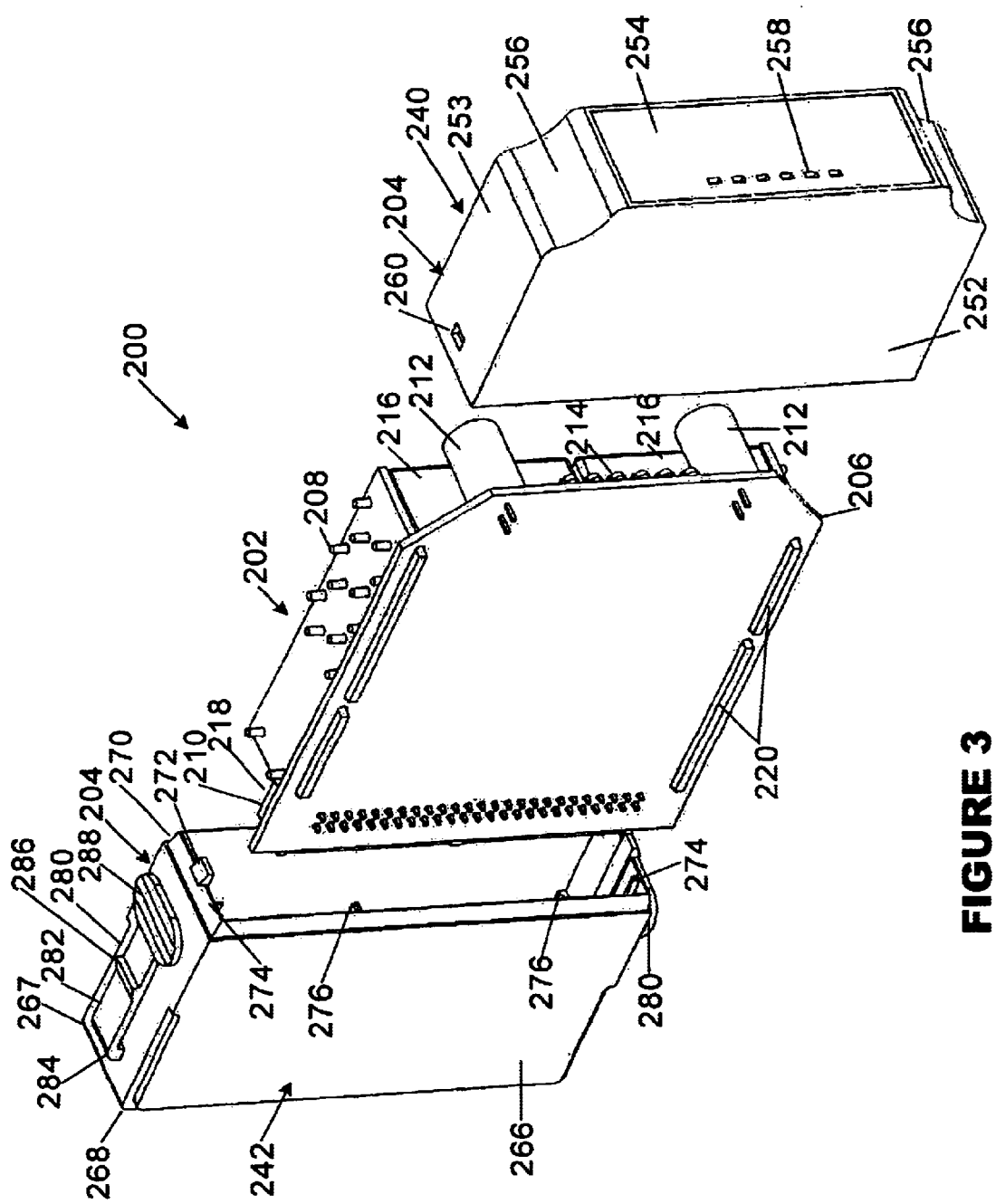
FIG. 3 is an exploded perspective view of the switch unit.
Figure 4:
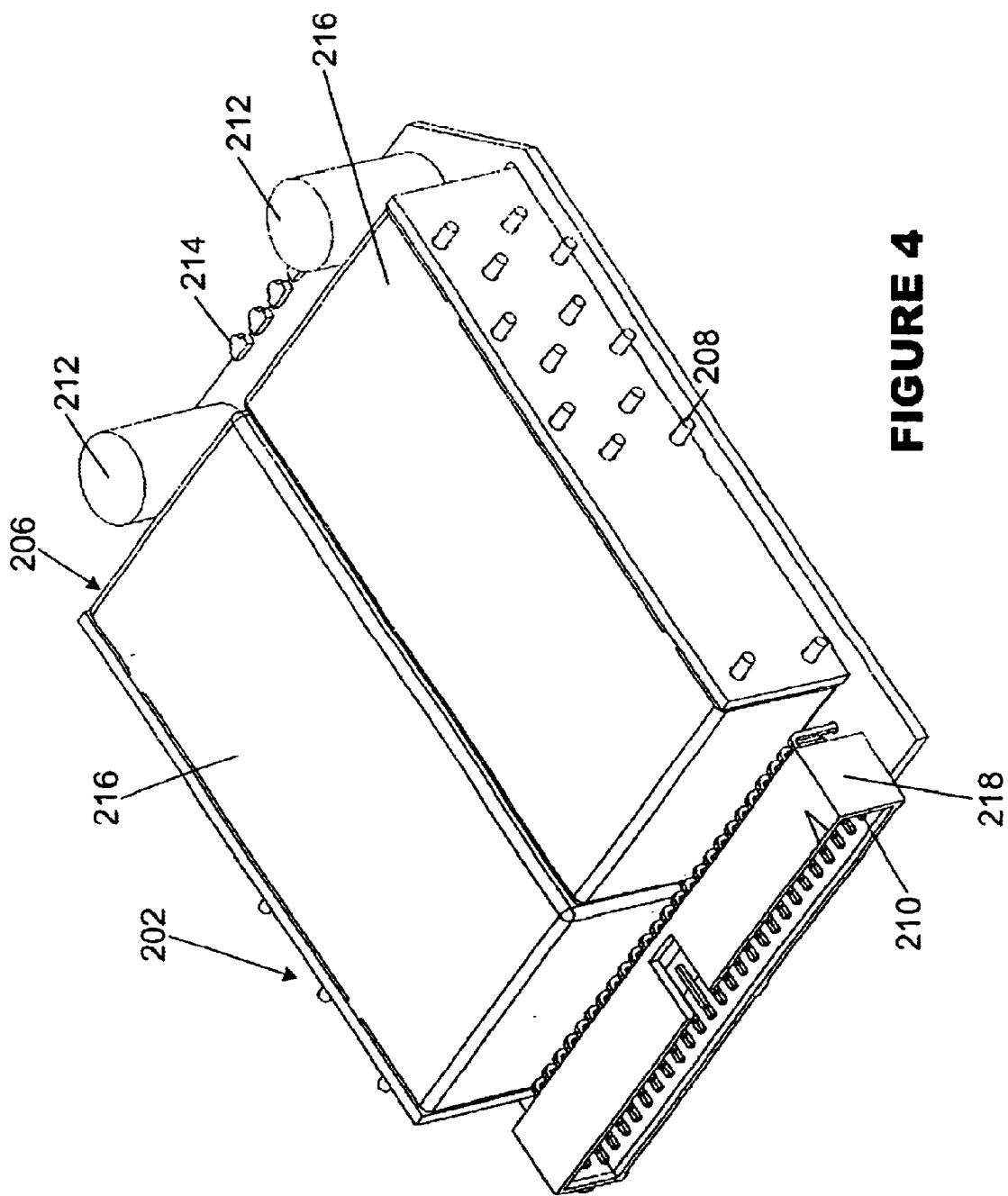
FIG. 4 is a top perspective view of a switch of the switch unit.

The switch unit 200 is illustrated isolated from the control unit 300 in FIG. 3 and the switch 202 is illustrated isolated from the housing 204 in FIG. 4. The illustrated switch 202 includes a circuit board 206 having the electrical circuitry necessary to convert the switch 202 to the emergency state if an emergency stop is necessary. In the illustrated exemplary embodiment, the electrical circuitry includes contact pins 208, male connectors 210 for mating with the control unit 300, capacitors 212, and LEDs 214. However, it should be noted that the electrical circuitry may vary depending on the desired circuit functions. Protective covers 216 and/or 218 may be provided for the contact pins 208 and/or male connections 210. The bottom surface of the circuit board 206 may be provided with spacers 220 to insure proper positioning relative to the switch unit's housing 204.

The switch unit's housing 204 preferably includes a plurality of housing sections 240 and 242 latched together to form a casing for the switch 202. In this manner, once the switch unit 200 is uncoupled from the control unit 300, the housing sections 240 and 242 may be unlatched for inspection and/or repair of the switch 202. In any event, the housing 204 is designed to protect the switch 202 against weather, dust, explosive situations, or other hazards presented by the environment in which the machine operates.

In the illustrated embodiment, the housing section 240 is a front housing section and the housing section 242 is a rear housing section. The front and rear housing sections 240 and 242 together form a roughly rectangular casing for the switch 202. The front housing section 240 includes side walls 252, top and bottom walls 253, and a front wall 254. The front portions of the walls 252 and 253, and the top and bottom portions of the front wall 254 are shaped to form concavely rounded cut-off corners 256 to accommodate the front cut-off corners of the circuit board 204. The front wall 254 includes a series of windows 258 for the LEDs 214. The top/bottom walls 254 each include a rectangular slot 260 for coordination with a latching component of the rear housing section 242 (namely a latching tab 272 introduced below). Although not visible in the illustrated orientation, the front housing section 240 may include rails and/or bars (similar to rails 274 and bars 276 introduced below in connection with the rear housing section 242) to insure proper positioning of the circuit board 206.

The rear housing section 242 includes side walls 266, top and bottom walls 267, and a rear wall 268. The front edges of the walls 266–268 are shaped to form an inward lip 272 and a sloped latching tab 272 extends outwardly from the top and bottom sections of the lip 270. The top and bottom walls 267 include rails 274 extending inwardly therefrom and one of the side walls 266 (the left-hand wall in FIG. 3) includes spacer bars 276 extending inwardly therefrom. In the assembled housing 204, the rear edges of the walls 252 and 253 of the front housing section 240 fit over the lip 272 and the latching tab 272 is snap fit into the slot 260 to secure the housing sections together. The rails 274 and bars 276 assure proper positioning of the circuit board 206 relative to the housing 204. Although not visible in the illustrated orientation, the rear wall 268 includes a rectangular window through which the male connectors 208 and the cover 218 extend.

The rear housing section 242 further includes coupling members 280 for selectively coupling the switch unit 200 to the control unit 300. In the illustrated switch unit 200, one coupling member 280 is attached to each the top and bottom walls of the rear housing section 242. Each coupling member 280 includes a resilient arm 282 attached to the top/bottom wall 253 by an elbow 284. The arm 282 includes a ramp 286 and a distal push tab 288. When selectively coupling the switch unit 200 to the control unit 300, the push tab 288 is pushed inward to allow the resilient arm to slide into or out of a groove (namely groove 360 introduced below) in the control unit 300.

Figure 5:
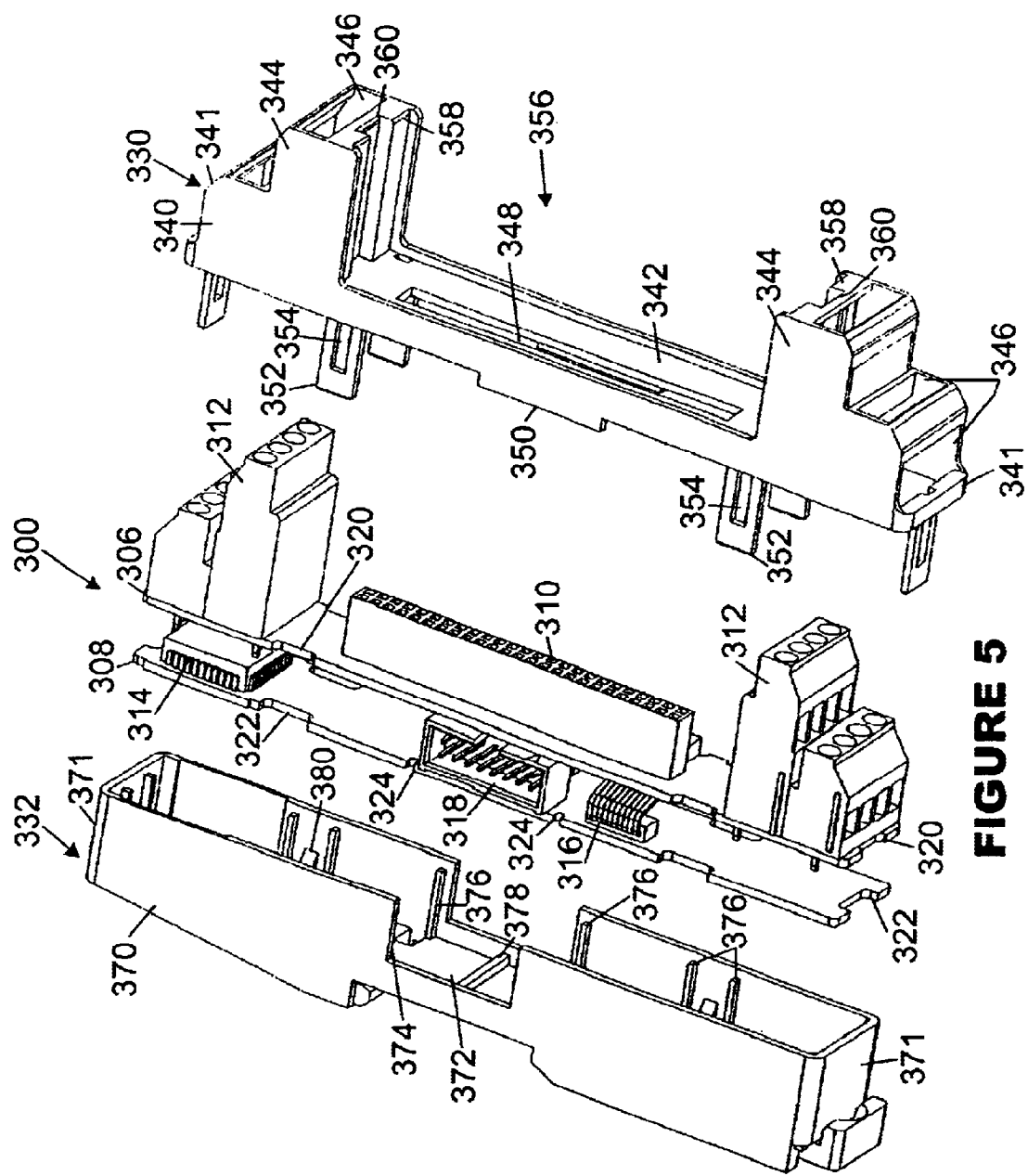
FIG. 5 is an exploded perspective view of the control unit.

Referring now to FIG. 5, the control unit 300 is illustrated isolated from the switch unit 200. The controller 302 comprises circuit boards 306 and 308 containing the components necessary to control the power source for the machine. In the illustrated embodiment, these components include a female connector base 310, stepped terminal blocks 312, a microprocessor 314, connectors 316 from the female connector base 310, and a network connector base 318. The circuit board 306 includes rectangular edge slots 320 arranged to correspond with latching components of the control housing 304 (namely latching tabs 352 introduced below). The circuit board 308 includes similar rectangular edge slots 322 except that they include expanded rectangular corners. The circuit board 308 additionally includes semi-circular slots 324 positioned on either side of the network connectors 318.

The controller housing 304 also preferably comprises a plurality of housing sections 330 and 332 latched together to form a casing for the controller 302. In this manner, the controller 302 may be easily accessed by unlatching the sections 330 and 332 once the switch unit 200 is uncoupled therefrom and typically once the control unit 300 is uncoupled from the machine. In any event, the housing 304 is designed to protect the controller 302 against weather, dust, heat, explosive situations, or other hazards presented by the environment of the particular machine.

In the illustrated embodiment, the housing section 330 is a front housing section and the housing section 332 is a rear housing section which together form a roughly C-shaped casing for the controller 302. The front housing section 330 includes side walls 340, top and bottom walls 341 and a rear wall 342. The walls 340 and 341 are shaped to form stepped corners 344 that accommodate the stepped terminal blocks 312 and to this end have windows 346 for access to the screws and/or wire openings of the terminal blocks. The rear wall 342 of the housing section 330 includes a rectangular window 348 to accommodate the female connector base 310. The side walls 340 each include a central rectangular tab 350 which together with the rear housing section 332 forms a window for the network connector base 318.

The front housing section 330 additionally comprises a plurality of latching tabs 352 which are used to latch the housing sections 330 and 332 together. In the illustrated housing section 330, the latching tabs 352 extend outwardly from the rear edges of the side walls 340 and the top/bottom walls 341. The tabs 352 are rectangular in shape and each includes a rectangular slot 354.

The front housing section 330 further comprises a rectangular recess 356 defined by the rear wall 342 and the stepped corners 344 and giving the housing section 330 its C-shape. Preferably, the surfaces of the stepped corners 344 defining the ends of the recess 356 include a rectangular groove 358 and a further rectangular groove 360. As is explained in more detail, this recess 356 and these grooves 358 and 360 provide interfacing and/or latching surfaces for the switch unit's housing 204 when selectively coupling/uncoupling the units 200 and 300 in a modular manner.

The rear housing section 332 comprises side walls 370, top/bottom walls 371, and a rear wall 372 which together form a roughly rectangular casing. The side walls 370 each include a central rectangular slot 374 which together with the tabs 350 of the front housing section 330 form a window for the network connector base 318. Stacking bars 376 are positioned on the side, top and bottom walls 370 and 371 to fit within the expanded corners of the rectangular edge slots 322 and the semicircular slots 324 of the circuit board 308. When the circuit board 308 is inserted into the rear housing section 332, it will slide past the stacking bars 376 while the circuit board 306 (which does not include the expanded corners and/or semicircular slots) will rest upon the top of the stacking bars 376. The rear wall 372 may also include spacing bars 378 to properly position the circuit board 308 relative thereto.

At least some of the stacking bars 376 are preferably also positioned to correspond to the latching tabs 352 of the front housing section 330. In the assembled housing 302, the latching tabs 352 are inserted between the appropriate stacking bar pairs to secure the housing sections 330 and 332 together. Ramps 380 are positioned between the pairs of stacking bars 376 for engagement with the tab's latching slots 354.

As was indicated above, the front housing section 330 interfaces with the switch unit's rear housing section 242 to allow selectively coupling/uncoupling of the switch unit 200 and the control unit 300. Specifically, when the switch unit 200 is modularly received within the rectangular recess 356, the male connector base 210 of the switch unit's circuit board 206 (which projects through the window in the switch unit's rear wall 268) mates with the female connector base 310 of the controller 302 (which projects through the window in the control unit's rear wall 342). In this manner, the switch 202 is operably coupled to the controller 302 whereby the controller 302 may appropriately control the power source when the switch 202 is converted to the emergency state.

Preferably, the emergency stop device 100 has a quick release coupling arrangement between the modular units 200 and 300. In the illustrated embodiment, this quick release arrangement is accomplished by the coupling members 280 of the switch unit 200 and the rectangular recess 356 of the control unit 300. Specifically, the push tabs 288 are pushed inward as the switch unit 200 is slid into the grooves 358 of the control unit 300 and released so that the resilient arm 282 is locked within the grooves 360. To uncouple the switch unit 200 from the control unit 300, the procedure is repeated in reverse.

Figure 6:
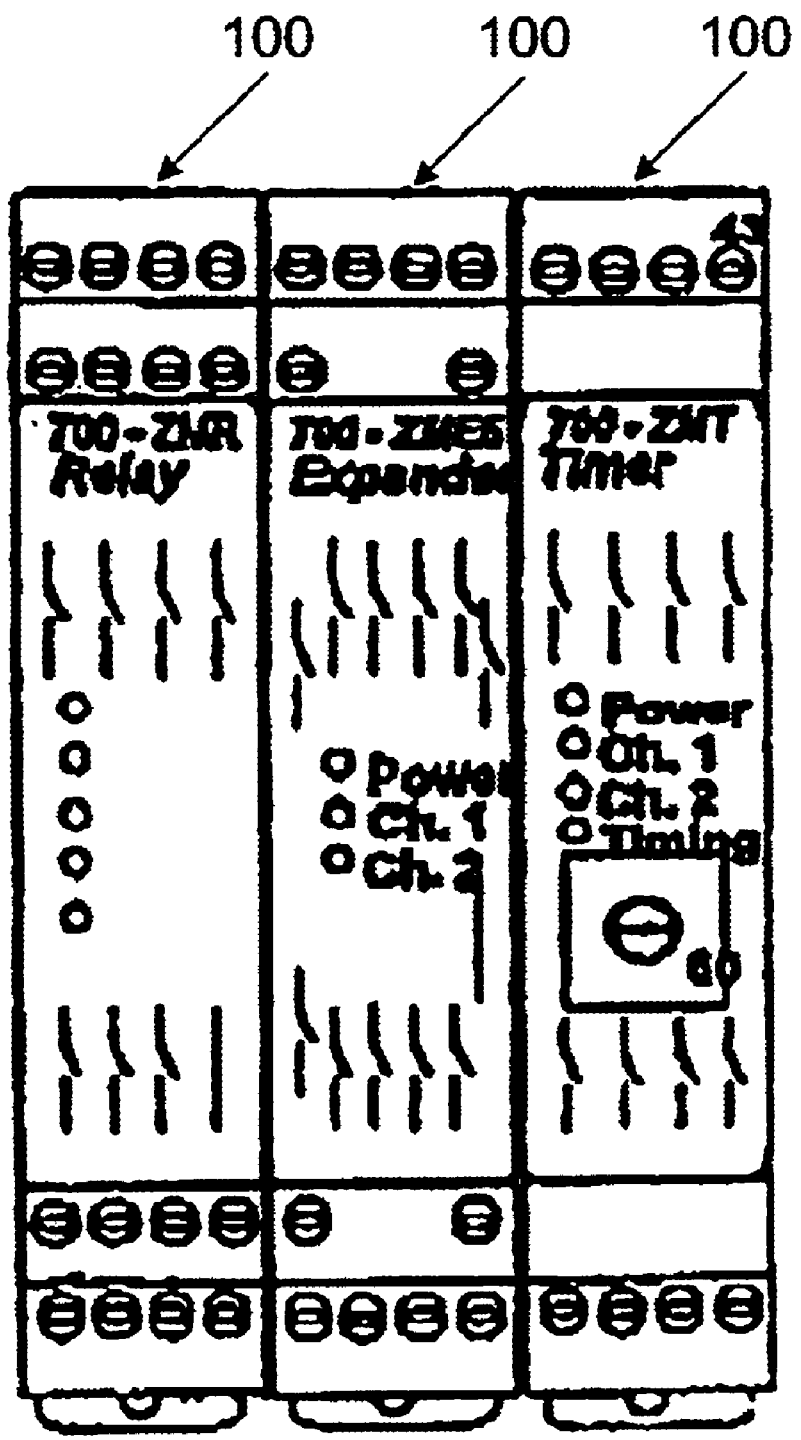
FIG. 6 is a schematic view of a network arrangement of a plurality of modular emergency stop devices.

As was indicated above, the control unit 300 includes a network connector base 318 that projects through a window in the controller housing 304. This allows the operable interconnection of a series of devices 100 as may be necessary in more sophisticated equipment, such as is shown in FIG. 6. The system of FIG. 6 advantageously provides for the integration of multiple emergency stop devices or emergency stop modules into a single unit and thereby eliminates any field wiring therebetween. Perhaps the best way to fully appreciate the advantageous features associated with the present invention is to briefly describe and highlight the disadvantages associated with conventional emergency stop systems.

Conventionally, an emergency stop is a monolithic structure or device having one or more outputs associated therewith that couple to machine safety switches via wiring. If, however, a particular machine has a greater number of peripherals to stop than the number of outputs available on the monolithic structure or device, a second monolithic expander structure or device is added and wired to the first or "master" emergency stop device. In addition, the expander outputs are wired to the additional machine peripherals which need to stop in an emergency.

The conventional emergency stop system configuration has a number of disadvantages. First, wiring an expander module to the master module takes two of the master emergency stop outputs. Therefore, for example, if the master emergency stop has eight outputs and the expander has eight outputs, wiring the expander to the master results in fourteen (14) total outputs instead of sixteen (16), as might otherwise be expected. In addition, if a second expander is added, the resulting system has twenty (20) total available outputs instead of twenty-four (24) since another two outputs are needed to wire in the additional expander. Clearly then, the conventional wiring configuration results in an inefficient utilization of emergency stop outputs and thereby negatively increases the emergency stop system cost.

Another disadvantage associated with conventional emergency stop system configurations is the wiring necessary to electrically connect the various separate, monolithic devices together. It is estimated that the wiring needed to interconnect the various monolithic emergency stop devices comprises about 20% of the total system wiring. Such an extensive amount of wiring is expensive and further adds to the total cost of the emergency stop system. In addition, the significant amount of wiring adds to the complexity and cost of servicing the emergency stop system. For example, a technician must navigate the maze of wiring between the various emergency stop devices when debugging system level errors or when running manual diagnostics.

In addition, the wiring interconnect methodology of conventional emergency stop systems creates a latent reliability problem and may provide a potential false sense of security. That is, the manner in which various monolithic expanders are wired to the master is often a function of the particular control methodology being employed and consequently must be wired in a particular fashion. If wired improperly, the error will not necessarily prohibit the machine or machines associated therewith from operating. Instead, the machine or machines may continue to operate and if an emergency condition arises and a safety switch is manually activated, the machine power may not be cut off, thus creating a safety hazard. Consequently, to ensure that such conditions do not occur, technicians must check and re-check the wiring interconnections in order to ensure reliability. Such redundancy takes a substantial amount of time and labor, and thereby further increases the cost of the conventional emergency stop system.

In stark contrast to conventional wired systems, the emergency stop system of the present invention utilizes modules 100 having connectors such as the network connector base 318 which are operable to couple the various modules together directly or substantially directly. The term "substantially directly" is used because the coupling of the modules 100 of the present invention contemplates any physical interconnection of the modules that eliminates the field wiring therebetween. For example, the modules may be directly connected together via the network connector bases 318, wherein one module 100 has a male-type connector and the neighboring module 100 has a female-type connector. Alternatively, the network connector bases 318 of neighboring modules 100 may be electrically connected together through an interface adaptor or the like. In either case, however, the modules are interconnected without the use of field wiring therebetween.

The coupling of the modules 100 in a direct or a substantially direct manner via, for example, the network connector bases 318 associated therewith, as illustrated in FIG. 6, advantageously provides for the integration of multiple emergency stop modules into a single unit. Further, use of the network connector bases 318 permit the various modules 100 to operatively engage one another in a side-to-side manner, as illustrated in FIG. 6, thereby providing for a minimal emergency stop system form factor. As a direct result, many of the significant disadvantages associated with the conventional wired interconnect systems are eliminated. For example, all the available outputs associated with the master control module and any expander modules are available for connecting to machine safety switches, thus substantially improving the output usage efficiency of the system. In addition, all the cost, complexity and reliability issues associated with the wiring of the master control module and various other modules is eliminated, since each module 100 may be directly coupled together via the network connector bases 318. Consequently, the entire system may be plugged into a din rail (not shown) as a single integrated unit and the only wiring necessary is for incoming power and the wiring associated with wiring the machine safety switches to the various outputs.

According to another aspect of the present invention, additional modules 100 that are not expanders may also be added to the system to provide various forms of functionality, as may be desired. For example, a power converter type module may be added to the system. In such a case, the power converter couples to the master control emergency stop module via connectors, for example, the network connector base 318 associated with each module. Preferably, the power converter receives a first power signal provided at the din rail, for example, 110 VAC line voltage, and converts the signal to a second power signal, for example, ±24 VDC for use by the master control module and the other modules. Use of the power converter advantageously eliminates the wiring interconnection between a monolithic power transformer and the monolithic master emergency stop device in conventional systems. In addition, further cost is eliminated by the system configuration of the present invention since each unit would otherwise require its own power supply.

According to another aspect of the present invention, the system of FIG. 6 may further include a communications module. The communications module is operable to interface with the master control emergency stop module in accordance with a first data format protocol, for example, DeviceNet, etc., and then convert the data received from the master control emergency stop module into a second data format protocol, for example, Ethernet, RS-232, etc. The communication module is further operable to transmit the data in the converted data format to accommodate the second communication protocol along a communication link. Such a link may be, for example, a coaxial cable, wireless RF, etc.

The operation of an exemplary emergency stop system of the present is as follows. A power converter module receives 110 VAC or 220 VAC line voltage and converts the line voltage to ±24 VDC for use in the control system. A master control emergency stop module is coupled to the power converter module directly or substantially directly through a connector, for example, the network connector base 318. On the other side of the master control emergency stop module is an expander module which provides a greater number of outputs for machine safety switches associated with one or more machines for which the system provides protection.

The ±24 VDC power is provided to the master control emergency stop module which taps onto the ±24 VDC on the circuit board 308 for powering the various circuits, etc. The ±24 VDC is also passed through to the expander module through the network connector base 318 on the other side of the module and the expander module uses the ±24 VDC in the same manner as the master control emergency stop module. Note that via use of the network connector bases 318, power is easily supplied to all modules without field wiring therebetween. In addition, although ±24 VDC is the preferred power level used in the preferred embodiment of the present invention, it should be understood that the present invention may use other voltage levels based on system requirements and/or needs and such variations are contemplated as falling within the scope of the present invention.

The master control emergency stop module also contains additional control circuitry on the circuit board 308 which provides system control based on varying user needs. For example, the control circuitry may be configured for E-stop control, two-hand control, etc., and configured for differing control interfaces for the outputs such as instantaneous off control or time-delay off control, etc. According to a preferred embodiment of the present invention, such control is hardware based relay control logic, and thus varying types of master control emergency stop modules may be selected by the user based on the various differing system control needs. Since all the control logic preferably is hardware based on the circuit board 308, the user does not have to execute a complicated wiring scheme between different monolithic blocks, and thus the present invention greatly reduces the time, money and complexity of control system set-up and further improves the system reliability. For example, the user simply orders the desired modules and plugs the modules together via, for example, the network connector bases 318. The user then only needs to wire the machine safety switches to the outputs, thus greatly simplifying the set-up process.

Although hardware based relay control logic is preferred, the present invention also contemplates a more sophisticated programmable controller on the circuit board 308 which allows different control configurations to be programmed therein, either by the manufacturer based on the user's system request, or at the system location by the user. In any event, the control portion 300 of the master control emergency stop module provides the necessary control circuitry to effectuate system control and the network connector base configuration allows for any easy interconnection to an expander without field wiring or the possibility of wiring the control circuitry to the expander improperly.

On the other side of the last expander module, a jumper preferably is coupled to the exposed network connector base 318 to close the circuit, as may be desired. As discussed supra, other modules may be easily integrated into the system based on the various system needs, for example, a communications module. Interface control between such modules and the master control emergency stop module is provided through the control circuitry on the circuit board 308 of the master control emergency stop device.

According to yet another aspect of the present invention, a method of configuring an emergency stop system is disclosed. Initially, the method contemplates the identification of the emergency stop system requirements. For example, determining the required number of outputs, whether a power converter is necessary, whether a two-hand type control or other type control is required, whether or not the output instantaneously shut off a safety switch or instead are on a timer, etc. Upon identifying the system requirements, the appropriate emergency stop system modules necessary to effectuate the system requirements are identified.

According to the present invention, the modules have connectors thereon, for example, the network base connectors 318, and are operable to directly connect or substantially directly connect together. The identified modules are then coupled together via the connectors preferably in a side-to-side orientation which provides a small form factor and eliminates field wiring therebetween. The coupling methodology also prevents the possibility of an incorrect wiring connection and thus improves system reliability. The emergency stop system then forms a single integral unit and may be easily plugged into a din rail or the like. Alternatively, the modules may be separately plugged into the din rail and then slid laterally to interconnect the various modules.

According to another aspect of the present invention, a diagnostics system for the emergency stop system is disclosed. The diagnostics system allows a user to obtain a quick status of each of the various modules within the system without having to disassemble the system and perform individual diagnostic tests thereon. In prior art emergency stop systems, no manner of automatically diagnosing the system existed. Instead, when a user became aware that a problem existed (either the machine was shut off without an emergency condition, or an emergency condition occurred and the machine was not properly shut off) the system had to be disassembled to identify the system failure. That is, each monolithic structure had to have its field wiring removed and then had to be taken apart to identify whether a problem existed. Alternatively, the complex field wiring had to be tediously examined to determine whether the system was wired together properly.

According to the present invention, a microprocessor is provided on the circuit board 308 of each module control unit 300 and each is programmed to carry out one or more diagnostic routines to ensure the proper operation of the respective module. Since the microprocessor is resident on the control unit 300, damage to the switch unit 200 associated therewith does not result in a costly failure. Instead, the modular switch unit 200 is merely replaced with a new switch unit 200 and the system is again operational. Further, since each control unit 300 diagnoses its own module, any failure or defect that occurs can be specifically identified. That is, both the nature of the failure and the module experiencing the failure is identified. Consequently, a user can quickly identify what is wrong with the system with particularity and replace that identified portion immediately, without having to analyze each module manually as in the prior art control systems.

The microprocessor on each of the modules, particularly the master control emergency stop module and the expander modules, is operable to analyze a variety of different status conditions of the module. For example, if a short circuit is detected within one of the modules, for example, where the ±24 VDC power terminals are shorted together due to some type of failure condition, the microprocessor will detect that condition and communicate it to the master control emergency stop module for appropriate action.

Other types of module diagnostics include, but are not limited to, an open contact detection routine, wherein the microprocessor determines whether a contact in the switch unit 200, upon being triggered to an open condition, properly resets back to a closed condition upon the removal of the emergency condition. In addition, the microprocessor may evaluate a reset push button (if one exists with the system) to determine whether the reset button is either stuck or otherwise being artificially held open or closed. Obviously, any other module condition that may be worthy of note may be monitored by the resident microprocessor and any such diagnostic routines to monitor such conditions are contemplated as falling within the scope of the present invention.

Diagnostic data collected by the microprocessor of each module is then transmitted through the system to the master control emergency stop module. According to a preferred embodiment of the present invention, if a status condition of one of the modules indicates a failure, the master control module shuts down the entire system, that is, the one or more machine associated therewith and provides a user indication regarding the nature of the failure and the module experiencing the failure condition. Such an indication can be provided, for example, locally at the system via a display and communications module electrically coupled thereto, or remotely via a communications module and a communication link. A user, upon receiving the failure indication, can then quickly replace the switch unit 200 associated with the failure and be operational again.

The diagnostic data is transmitted by the microprocessor of each module through the connectors, for example, the network connector bases 318, to the master control module. In one embodiment, each piece of status data can be transmitted as a single status bit on individual pins. In such a case, the control module receives a serial data string for each pin, wherein the string contains a plurality of data packets that provide a particular type of status information for each respective module in the system (i.e., first packet has data for expander #1, second packet contains data for expander #2, etc.) Alternatively, the microprocessor may use a plurality of pins to represent a status of a particular module. Any manner of communicating the diagnostic data through the connectors may be implemented and is contemplated as falling within the scope of the present invention.

In summary, with or without a networking arrangement, the modular coupling between the switch unit 200 and the control unit 300 provides many advantages over traditional single unit emergency stop systems. For example, in the event of a faulty switch, the switch unit 200 is simply disconnected from the control unit 300 and replaced with a new switch unit. The replaced switch unit could be sent to a facility for testing and/or repair. Additionally, this arrangement allows an efficient preventive maintenance program. Specifically, a switch unit 200 could be uncoupled from the control unit 300, tested by an appropriate electrical testing device, and then recoupled to the control unit 300 if the testing reveals that the switch was still suitable. Alternatively, the present invention allows an inventory of back-up switch units to be available for easy replacement, thereby eliminating the need for a technician to fix failed switch units. A further advantage is that the control unit 300 could be made compatible with a plurality of different types of switch units 200, thereby streamlining manufacturing procedures and/or inventory requirements. Still another advantage of the present invention is that replacing the switch unit 200 does not require any rewiring of the control unit 300. Yet another advantage of the present invention is that diagnostic data can be sent via the network connector base 318 for network communications, thereby allowing service technicians, etc. an easy way to identify the status of the various switch units.

One may now appreciate that the present invention provides an emergency stop device 100 wherein the switch 202 and the controller 302 are contained in separate modular units 200 and 300 thereby allowing the switch 202 to be readily replaced without replacement and/or reinstallment of the controller 302. Although the invention has been and described with respect to certain preferred embodiments, it is obvious that equivalent alterations and modifications will occur to others skilled in the art upon a reading and understanding of this specification. The present invention includes all such equivalent alterations and modifications. It should also be noted that the directional terms and modifiers, such as front, rear, side, top, bottom, etc. used to describe the device 100 correspond to the illustrated orientation. These directional terms have been used only for convenience and ease in explanation with respect to the illustrated embodiment of emergency stop device 100. They are not intended to, and do not, limit the device 100 to any particular orientation or direction.

What is claimed:

1. A modular emergency stop device comprising:
   a switch unit including:
      a switch which converts from a normal state to an emergency state when an emergency stop is necessary; and
      a housing for the switch; and
   a control unit including:
      a controller which controls a power source for a machine; and
      a housing for the controller,
   wherein, the housing for the switch and the housing for the controller are coupled together in a quick release arrangement, the quick release arrangement including a resilient arm, the resilient arm comprising a manually depressible mechanism for rapid decoupling of the housing for the switch from the housing for the controller.

2. The modular emergency stop device of claim 1, wherein the resilient arm includes a ramp and a push tab, the push tab allowing the resilient arm to slide into a groove in the control unit.

3. The modular emergency stop device of claim 1, wherein the control unit includes a rectangular recess which provides a surface for interfacing with the switch unit.

4. The modular emergency stop device of claim 1, wherein the modular emergency stop device can be coupled to at least one other modular emergency stop device in a side-by-side manner.

5. The modular emergency stop device of claim 1, wherein the switch comprises a circuit board having electrical circuitry for converting the switch to the emergency state.

6. The modular emergency stop device of claim 5, wherein the electrical circuitry includes contact pins.

7. The modular emergency stop device of claim 1, wherein the switch includes an electrical mating base and the controller includes an electrical mating base that mates with the switch's electrical mating base when the housings are coupled together and wherein the switch unit's housing includes a window for the switch's electrical mating base and the control unit's housing includes a window for the controller's electrical mating base.

8. The modular emergency stop device of claim 7, wherein the housing for the controller includes a recess and a portion of the housing for the switch is received within the recess when housings are selectively coupled together; and wherein the window for the controller's electrical mating base is located on a surface defining the recess and the window for the switch's electrical mating base is located on the portion of the housing for the switch received within the recess.

9. The modular emergency stop device of claim 7, wherein one of the electrical mating bases is a female mating base and the other is a male mating base.

10. The modular emergency stop device of claim 1, wherein the housing for the switch includes a plurality of housing sections latched together to form a casing for the switch.

11. The modular emergency stop device of claim 10, wherein the plurality of housing sections include a front housing section and a rear housing section, the rear housing section being adapted to interface with the control unit.

12. The modular emergency stop device of claim 1, wherein the housing for the controller includes a plurality of housing sections latched together to form a casing for the controller.

13. The modular emergency stop device of claim 1, wherein the controller is compatible with a plurality of switch units of different types compatible with different emergency stop conditions.

14. The modular emergency stop device of claim 1, wherein the controller includes a network interconnection base and wherein the control unit's housing includes a window for the network interconnection base.

15. An emergency stop system comprising a plurality of the modular emergency stop devices of claim 14 communicating among each other to determine an appropriate course of emergency action.

16. A method of replacing the switch in the modular emergency stop device of claim 1, said method comprising:

uncoupling the housing for the switch from the housing for the controller to remove the switch unit;

providing a new switch unit;

coupling a new housing for the new switch to the housing for the controller.

17. The method of claim 16, wherein at least one push tab is employed to uncouple the housing for the switch and couple the new housing for the new switch.

18. A method of testing the switch of the modular emergency stop device of claim 1, said method comprising:

uncoupling the housing for the switch from the housing for the controller to remove the switch unit;

testing the uncoupled switch unit;

recoupling the tested switch unit to the controller unit if testing reveals that the switch is acceptable.

19. A method of configuring the modular emergency stop device of claim 1 comprising:

providing a plurality of switch units of different types compatible with the desired emergency stop conditions;

programming the controller to be compatible with each of the plurality of switch units;

selecting the appropriate type of switch unit for the desired emergency stop conditions; and providing the controller with the selected switch unit.

20. A method of fabricating a modular emergency stop device comprising:

providing a housing for a switch; and providing a housing for a controller, wherein, the housing for the switch includes at least one resilient arm for coupling with at least one groove located in the housing for the controller, the at least one resilient arm comprising s manually depressible device that permits the resilient arm to slide into and out of a groove in the control unit.

21. A modular emergency stop device comprising:

means for converting from a normal state to in emergency state when an emergency stop is necessary;

means for controlling a power source for a machine; and quick release means for coupling and decoupling the means for converting and the means for controlling, the quick release means comprising a means for manually effectuating a quick release.

* * * * *

UNITED STATES PATENT AND TRADEMARK OFFICE
CERTIFICATE OF CORRECTION

PATENT NO. : 6,686,672 B2
DATED : March 10, 2004
INVENTOR(S) : Paul C. Brown et al.

It is certified that error appears in the above-identified patent and that said Letters Patent is hereby corrected as shown below:

<u>Column 14,</u>
Line 11, "s manually" should be -- a manually --
Line 15, "in" should be -- an --

Signed and Sealed this

Fifteenth Day of June, 2004

JON W. DUDAS
*Acting Director of the United States Patent and Trademark Office*